United States Patent
Kim et al.

(10) Patent No.: US 11,037,728 B2
(45) Date of Patent: Jun. 15, 2021

(54) DIELECTRIC AND CAPACITOR AND ELECTRONIC DEVICE

(71) Applicant: SAMSUNG ELECTRONICS CO., LTD., Suwon-si (KR)

(72) Inventors: Jinhong Kim, Seoul (KR); Se Yun Kim, Seoul (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 281 days.

(21) Appl. No.: 16/223,209

(22) Filed: Dec. 18, 2018

(65) Prior Publication Data

US 2019/0198244 A1 Jun. 27, 2019

Related U.S. Application Data

(60) Provisional application No. 62/609,869, filed on Dec. 22, 2017.

(30) Foreign Application Priority Data

Mar. 23, 2018 (KR) .................. 10-2018-0034070

(51) Int. Cl.
| | |
|---|---|
| H01G 4/10 | (2006.01) |
| H01L 49/02 | (2006.01) |
| H01G 4/008 | (2006.01) |
| H01L 29/51 | (2006.01) |

(52) U.S. Cl.
CPC ............... *H01G 4/10* (2013.01); *H01G 4/008* (2013.01); *H01L 28/40* (2013.01); *H01L 28/60* (2013.01); *H01L 28/90* (2013.01); *H01L 29/517* (2013.01)

(58) Field of Classification Search
CPC .......... H01G 4/10; H01G 4/008; H01L 28/60; H01L 29/517
See application file for complete search history.

(56) References Cited

U.S. PATENT DOCUMENTS

| | | | |
|---|---|---|---|
| 4,075,681 A | | 2/1978 | Popowich |
| 6,020,024 A | * | 2/2000 | Maiti ............... H01L 21/28185 |
| | | | 257/E29.16 |
| 6,125,027 A | | 9/2000 | Klee et al. |
| 6,831,313 B2 | | 12/2004 | Uchiyama et al. |
| 9,156,930 B2 | | 10/2015 | Koh et al. |
| 2002/0149011 A1 | | 10/2002 | Gutsche et al. |
| 2002/0168785 A1 | | 11/2002 | Paz De Araujo et al. |

(Continued)

FOREIGN PATENT DOCUMENTS

| | | | |
|---|---|---|---|
| CN | 101894887 A | * | 11/2010 |
| CN | 103628037 A | | 3/2014 |

(Continued)

OTHER PUBLICATIONS

Su et al., "Wide Range Bandgap Modulation Based on ZnO-based Alloys and Fabrication of Solar Blind UV Detectors with High Rejection Ratio", Aug. 4, 2014, ACS Appl. Mater. Interfaces, 14152-14158 (Year: 2014).*

(Continued)

*Primary Examiner* — Nathan Milakovich
(74) *Attorney, Agent, or Firm* — Cantor Colburn LLP

(57) ABSTRACT

A dielectric including a composite including a metal oxide having a rocksalt crystal structure and a beryllium oxide, and a capacitor, a transistor, and an electronic device including the same.

23 Claims, 5 Drawing Sheets

(56) References Cited

U.S. PATENT DOCUMENTS

| | | | |
|---|---|---|---|
| 2003/0168705 A1 | 9/2003 | Tanida et al. | |
| 2011/0227479 A1 | 9/2011 | Taniguchi et al. | |
| 2012/0293909 A1 | 11/2012 | Tatemichi et al. | |
| 2014/0002956 A1* | 1/2014 | Tan | H01G 11/86 361/502 |
| 2019/0333858 A1* | 10/2019 | Kim | H01L 21/02194 |

FOREIGN PATENT DOCUMENTS

| | | |
|---|---|---|
| JP | 1998083934 A | 3/1998 |
| JP | 2003258242 A | 9/2003 |
| JP | 2004520721 A | 7/2004 |
| KR | 20110057258 A | 5/2011 |
| WO | 2003096390 A1 | 11/2003 |

OTHER PUBLICATIONS

Kanghoon Yim et al., "Novel high-κ dielectrics for next-generation electronic devices screened by automated ab initio calculations", NPG Asia Materials, Jun. 12, 2015, pp. 1-6, vol. 7.

Seong Keun Kim et al., "Capacitors with an Equivalent Oxide Thickness of < 0.5 nm for Nanoscale Electronic Semiconductor Memory", Advanced Functional Materials, Aug. 23, 2010, pp. 2989-3003, vol. 20, Issue 18.

\* cited by examiner

DIELECTRIC AND CAPACITOR AND ELECTRONIC DEVICE

CROSS-REFERENCE TO RELATED APPLICATION

This application claims priority to and the benefit of U.S. provisional Application No. 62/609,869 filed on Dec. 22, 2017 and Korean Patent Application No. 10-2018-0034070 filed in the Korean Intellectual Property Office on Mar. 23, 2018, and all the benefits accruing therefrom under 35 U.S.C. § 119, the entire contents of which are incorporated herein by reference.

BACKGROUND

1. Field

A dielectric, a capacitor, and an electronic device are disclosed.

2. Description of the Related Art

A dielectric has been used in a capacitor or a transistor of various electronic devices such as a central processing unit (CPU), dynamic random-access memory (DRAM), and flash memory.

A pitch size of electronic devices has been continuously decreased according to a Moore's law. As the pitch size is decreased, a technological challenge is to secure, e.g., provide desirable, capacitance of the capacitor. The capacitance may be proportional to an area and may be decreased, as the pitch size is decreased.

In order to secure, e.g., provide desirable, capacitance in this small pitch size, research on a dielectric having a high dielectric constant is being conducted.

However, a dielectric having a high dielectric constant may have a large energy bandgap, and accordingly, since a charge injection from an electrode to the dielectric may be weakened, the dielectric may cause or have a leakage current.

SUMMARY

An embodiment provides a dielectric capable of decreasing a leakage current while having a high dielectric constant.

An embodiment provides a capacitor including the dielectric.

An embodiment provides an electronic device including the dielectric or the capacitor.

According to an embodiment, a dielectric includes a composite including a metal oxide having a rocksalt crystal structure and a beryllium oxide.

The metal oxide having the rocksalt crystal structure may include a Group II element except beryllium.

The metal oxide having the rocksalt crystal structure may include Mg, Ca, Sr, Ba, or a combination thereof.

The composite may include a first layer including the metal oxide having the rocksalt crystal structure and a second layer on the first layer, the second layer including the beryllium oxide.

The dielectric may further include a third layer on the second layer, the third layer including the beryllium oxide.

The composite may include more than one of the first layer or more than one of the second layer wherein the more than one of the first layer, the more than one of the second layer, or both may each independently be stacked continuously or discontinuously.

In a crystal structure of the beryllium oxide of the second layer, a Be—O bond length may be longer than a Be—O bond length in a beryllium oxide of a Wurtzite crystal structure.

In a crystal structure of the beryllium oxide of the second layer, the Be—O bond length may be greater than or equal to about 1.70 angstroms (Å).

In a crystal structure of the beryllium oxide of the second layer, the Be—O bond length may be about 1.70 Å to about 1.83 Å.

The first layer and the second layer may independently be an atomic layer deposition film.

The composite may be a multi-nary oxide of the metal oxide having the rocksalt-type crystal structure and the beryllium oxide.

The multi-nary oxide may be represented by Chemical Formula 1.

$$(Be_{1-x}M_x)O \qquad \text{Chemical Formula 1}$$

In Chemical Formula 1,
M is a Group II element except beryllium, and
$0 < x \leq 0.80$.

In a crystal structure of the multi-nary oxide, a Be—O bond length may be greater than or equal to about 1.70 Å.

The Be—O bond length of the multi-nary oxide may be about 1.70 Å to about 1.83 Å.

In the crystal structure of the multi-nary oxide, an M-O bond length may be longer than the Be—O bond length.

The multi-nary oxide may be an atomic layer deposition film.

The dielectric may have a dielectric constant (k) of greater than or equal to about 10 and an energy bandgap of greater than or equal to about 6 electronvolts (eV).

The dielectric may satisfy Relationship Equation 1.

$$E_g \times k > 80 \qquad \text{Relationship Equation 1}$$

In Relationship Equation 1,
$E_g$ is an energy bandgap (eV), and
k is a dielectric constant.

According to an embodiment, a capacitor includes a pair of electrodes facing each other and the dielectric between the pair of electrodes.

According to an embodiment, a transistor including the dielectric is provided.

According to an embodiment, an electronic device including the capacitor or the transistor is provided.

According to an embodiment, an electronic device including the dielectric is provided.

The dielectric may be capable of decreasing a leakage current while having a high dielectric constant.

DETAILED DESCRIPTION

Figure 1:
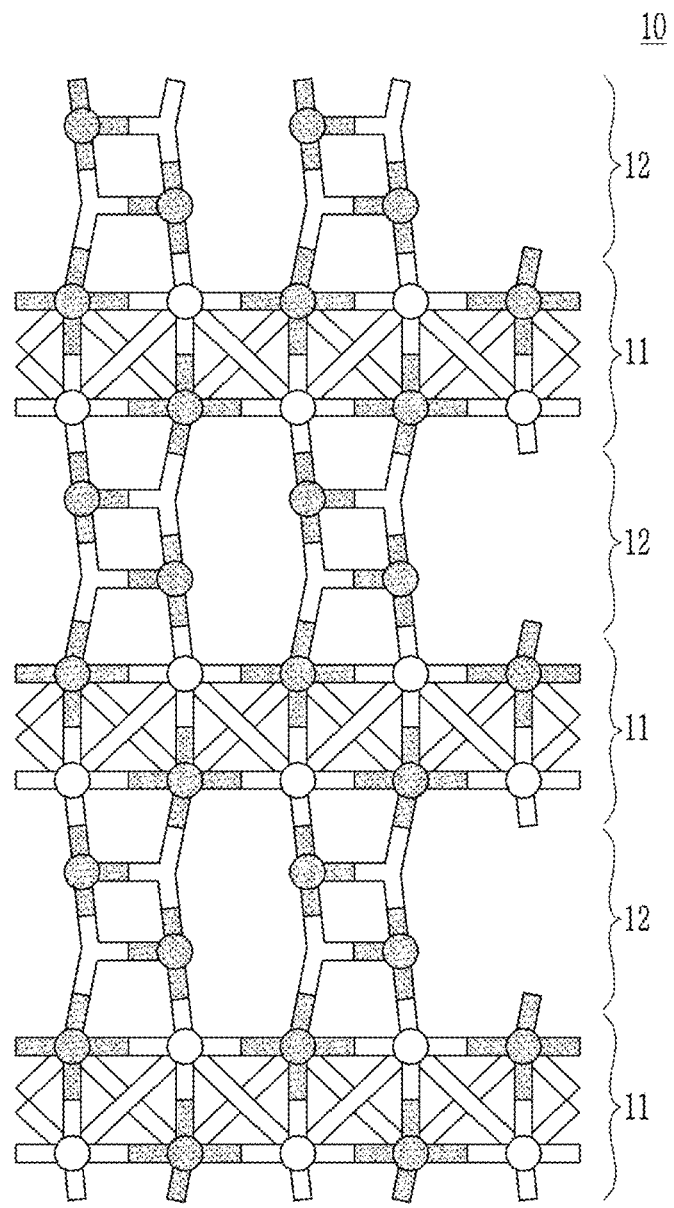
FIG. 1 is a schematic view showing a composite including a beryllium oxide and a metal oxide having a rocksalt-type crystal structure according to an embodiment.

Hereinafter, example embodiments of the present disclosure will be described in detail so that a person skilled in the art would understand the same. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, the phrase "rocksalt-type crystal structure" or "rocksalt crystal structure" are the same and refer to the space group called Fm3m (in Hermann-Mauguin notation), or "225" (in the International Tables for Crystallography). The Strukturbericht designation is "B1". In the rocksalt crystal structure, each of the two atom types forms a separate face-centered cubic lattice, with the two lattices interpenetrating so as to form a 3D checkerboard pattern, i.e., a face-centered cubic structure with secondary atoms in its octahedral holes. The coordination number of each atom in this structure is 6: each cation is coordinated to 6 anions at the vertices of an octahedron, and similarly, each anion is coordinated to 6 cations at the vertices of an octahedron.

As used herein, the phrase "Wurtzite crystal structure" refers to a member of the hexagonal crystal system and includes stacked tetrahedrally coordinated atoms.

Hereinafter, a dielectric according to an embodiment is described.

A dielectric according to an embodiment includes a composite of a beryllium oxide and a metal oxide having a rocksalt-type crystal structure. The composite may include (comprise), consist essentially of, or consist of, the beryllium oxide and a metal oxide having a rocksalt-type crystal structure.

The beryllium oxide may be represented by BeO and may have a Be—O bond. A stable phase of the beryllium oxide under ambient conditions may be a Wurtzite crystal structure.

The metal oxide of rocksalt-type crystal structure refers to a metal oxide wherein a stable phase under ambient conditions is a rocksalt-type crystal structure. The metal oxide of rocksalt-type crystal structure may include for example a Group II element (except beryllium), for example Mg, Ca, Sr, Ba, or a combination thereof. The metal oxide of rocksalt-type crystal structure may have Mg—O bonds, Ca—O bonds, Sr—O bonds, Ba—O bonds, or a combination thereof.

The composite of the beryllium oxide and the metal oxide having the rocksalt-type crystal structure (hereinafter, referred to as 'composite') may be an atomic layer deposition film and may have for example a thickness of about 1 nanometers (nm) to about 50 nm. Within the ranges, a thickness of the composite may be for example about 1 nm to about 40 nm, about 1 nm to about 30 nm, about 1 nm to about 20 nm, about 2 nm to about 30 nm, about 2 nm to about 20 nm, about 2 nm to about 15 nm, about 2 nm to about 10 nm, or about 5 nm to about 10 nm.

The composite may have a relatively high dielectric constant and large energy bandgap, for example a dielectric constant (k) of greater than or equal to about 10 and an energy bandgap of greater than or equal to about 6 eV, for example a dielectric constant (k) of greater than or equal to about 10 and an energy bandgap of greater than or equal to about 8 eV. Within the ranges, the dielectric constant (k) of the composite may be for example greater than or equal to about 12, greater than or equal to about 14, greater than or equal to about 16, greater than or equal to about 18, greater than or equal to about 20, greater than or equal to about 22, greater than or equal to about 24, greater than or equal to about 26, greater than or equal to about 28, greater than or equal to about 30, greater than or equal to about 32, greater than or equal to about 34, greater than or equal to about 36, greater than or equal to about 38, or greater than or equal to about 40. Within the ranges, the dielectric constant (k) of the composite may be for example less than or equal to about 1,000, less than or equal to about 800, less than or equal to about 600, less than or equal to about 400, less than or equal to about 300, less than or equal to about 200, or less than or equal to about 100. Within the ranges, the energy bandgap of the composite may be for example greater than or equal to about 10 eV, greater than or equal to about 12 eV, greater than or equal to about 14 eV, greater than or equal to about 16 eV, greater than or equal to about 18 eV, or greater than or equal to about 20 eV. Within the ranges, the energy bandgap of the composite may be for example less than or equal to about 50 eV, less than or equal to about 45 eV, less than or equal to about 40 eV, less than or equal to about 35 eV, or less than or equal to about 30 eV.

The composite may satisfy for example Relationship Equation 1 with respect to the dielectric constant and the energy bandgap.

$$E_g \times k > 80 \quad \text{Relationship Equation 1}$$

In Relationship Equation 1,
$E_g$ is an energy bandgap (eV), and
k is a dielectric constant.

The composite may satisfy for example Relationship Equation 1a, 1b, or 1c.

$$E_g \times k \geq 90 \quad \text{Relationship Equation 1a}$$

$$E_g \times k \geq 95 \quad \text{Relationship Equation 1b}$$

$$E_g \times k \geq 100 \quad \text{Relationship Equation 1c}$$

For example, the composite may for example satisfy Relationship Equation 1 while having a dielectric constant (k) of greater than or equal to about 10 and an energy bandgap of greater than or equal to about 6 eV.

For example, the composite may for example satisfy Relationship Equation 1 while having a dielectric constant (k) of greater than or equal to about 10 and an energy bandgap of greater than or equal to about 8 eV.

For example, the composite may for example satisfy Relationship Equation 1a while having a dielectric constant (k) of greater than or equal to about 10 and an energy bandgap of greater than or equal to about 6 eV.

For example, the composite may for example satisfy Relationship Equation 1a while having a dielectric constant (k) of greater than or equal to about 10 and an energy bandgap of greater than or equal to about 8 eV.

For example, the composite may for example satisfy Relationship Equation 1b while having a dielectric constant (k) of greater than or equal to about 10 and an energy bandgap of greater than or equal to about 6 eV.

For example, the composite may for example satisfy Relationship Equation 1b while having a dielectric constant (k) of greater than or equal to about 10 and an energy bandgap of greater than or equal to about 8 eV.

For example, the composite may for example satisfy Relationship Equation 1c while having a dielectric constant (k) of greater than or equal to about 10 and an energy bandgap of greater than or equal to about 6 eV.

For example, the composite may for example satisfy Relationship Equation 1c while having a dielectric constant (k) of greater than or equal to about 10 and an energy bandgap of greater than or equal to about 8 eV.

Since an energy bandgap has a trade-off, i.e., inverse, relationship with a dielectric constant, a dielectric may rarely have both a relatively high dielectric constant and large energy bandgap, simultaneously.

A beryllium oxide may simultaneously have a relatively high dielectric constant and large energy bandgap, for example, a beryllium oxide having a rocksalt-type crystal structure may simultaneously have a relatively high dielectric constant and large energy bandgap. However, since a stable phase of the beryllium oxide under ambient conditions is a Wurtzite crystal structure, it may be difficult to obtain the beryllium oxide having the rocksalt-type crystal structure under ambient conditions. For example, a phase transformation of the beryllium oxide from the Wurtzite crystal structure to the rocksalt-type crystal structure may require a pressure of greater than or equal to about 100 gigapascals (GPa) and thus may be difficult to practically realize in a thin film process.

In order to overcome this practical limit, an embodiment may simultaneously have a relatively high dielectric constant and large energy bandgap. The dielectric may include a metal oxide having a rocksalt-type crystal structure, which is a stable phase under ambient conditions, and a beryllium oxide as a composite.

The composite includes an oxide including a Group II element such as Mg, Ca, Sr, Ba, or a combination thereof belonging to the same Group as beryllium (Be) as the metal oxide having a rocksalt-type crystal structure, so that the electrons have a substantially equivalent valence, and thus may decrease defects due to a charge compensation and resultantly, secure, e.g., provide, relatively high stability.

Table 1 compares expected dielectric constant and energy bandgap of the dielectric according to an embodiment with those of a metal oxide having a rocksalt-type crystal structure, a beryllium oxide (w-BeO) having a Wurtzite crystal structure, and a commercially available dielectric, $ZrO_2$. Herein, the dielectric constant and the energy bandgap are calculated according to VASP (5.4.4. version).

TABLE 1

| | Dielectric constant (k) | Energy bandgap (eV) |
|---|---|---|
| Composite | 12.9 | 10 |
| Wurtzite BeO | 7 | 10.6 |

TABLE 1-continued

| | Dielectric constant (k) | Energy bandgap (eV) |
|---|---|---|
| MgO | 9 | 7.8 |
| CaO | 11.8 | 7.7 |
| SrO | 13.3 | 5.5 |
| BaO | 35 | 3.9 |
| $ZrO_2$ | 40 | 5.8 |

The composite may be embodied in various methods.

For example, the composite may have a layered (layer-by-layer) structure, for example a layered structure including a first layer including a metal oxide of rocksalt-type crystal structure and a second layer grown on the first layer and including beryllium oxide.

FIG. 1 is a schematic view showing a composite according to an embodiment.

Referring to FIG. 1, the composite 10 according to an embodiment may have a layered structure, and may include for example a first layer 11 including a metal oxide of rocksalt-type crystal structure and a second layer 12 on, e.g., grown on the first layer 11 and including beryllium oxide.

The layered structure may be a structure formed by repeating n times (n is an integer): stacking the first layer 11 and the second layer 12 as a unit layer, and herein, for example, n may be an integer from 1 to 100.

The first layer 11 may include the metal oxide having the rocksalt-type crystal structure represented by MO, wherein M is a Group II element except for beryllium and selected for example from Mg, Ca, Sr, and Ba. The first layer 11 may be an atomic layer deposition film and have a rocksalt crystal structure which is a stable phase under ambient conditions. For example, when the metal oxide having the rocksalt-type crystal structure is MgO, CaO, SrO, or BaO, a bond length of Mg—O, Ca—O, Sr—O, or Ba—O may be respectively about 2.11 Å, about 2.39 Å, about 2.57 Å, or about 2.76 Å. The first layer 11 may have for example a thickness of about 1 nm to about 25 nm.

The second layer 12 may include beryllium oxide represented by BeO. The second layer 12 may be an atomic layer deposition film and may for example have a thickness of about 1 nm to about 25 nm.

Since the beryllium oxide of the second layer 12 is epitaxially grown on the rocksalt-type crystal structure of the first layer 11, the beryllium oxide of the second layer 12 may have a different structure from a crystal structure that is a stable phase of beryllium oxide, for example, a Wurtzite crystal structure, and may have a modified crystal structure.

For example, in a crystal structure of beryllium oxide of the second layer 12, a Be—O bond length may be different from a Be—O bond length in a Wurtzite crystal structure and for example in the crystal structure of beryllium oxide of the second layer 12, the Be—O bond length may be longer than the Be—O bond length in the Wurtzite crystal structure.

For example, in the crystal structure of beryllium oxide of the second layer 12, the Be—O bond length may be longer than the Be—O bond length in the Wurtzite crystal structure and may be shorter than the M-O bond length of the rocksalt-type crystal structure of the first layer 11. The crystal structure of the beryllium oxide of the second layer 12 may have a Be—O bond length change depending on an epitaxial growth on the rocksalt-type crystal structure of the first layer 11.

For example, in the crystal structure of beryllium oxide of the second layer 12, the Be—O bond length may be greater than or equal to about 1.70 Å, for example about 1.70 Å to about 1.83 Å. For the reference, in the Wurtzite crystal structure, the Be—O bond length is about 1.66 Å.

Figure 2:
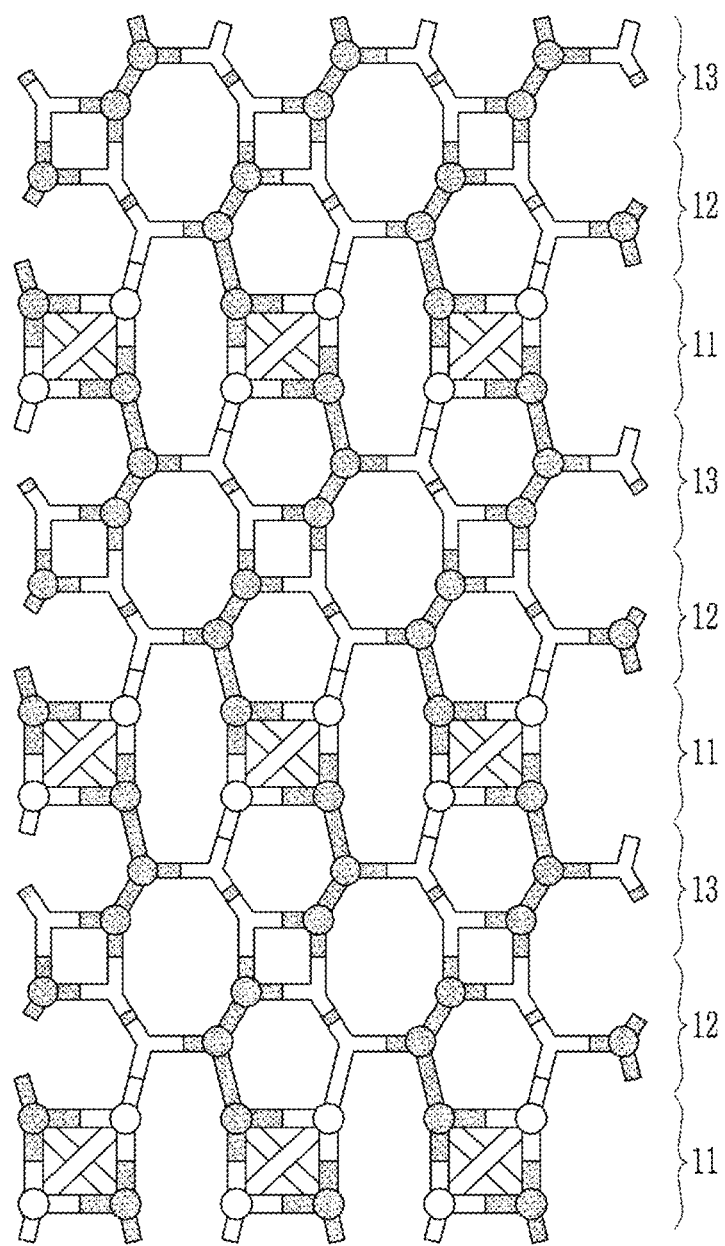
FIG. 2 is a schematic view showing composite including a beryllium oxide and a metal oxide having a rocksalt-type crystal structure according to an embodiment.

FIG. 2 is a schematic view showing composite according to an embodiment.

Referring to FIG. 2, the composite 10 according to an embodiment may have a layered structure, for example and may include first layer 11 including a metal oxide of rocksalt-type crystal structure, a second layer 12 on, for example grown on, the first layer 11 and including beryllium oxide, and a third layer 13 on, for example grown on, the second layer 12 and including beryllium oxide.

The layered structure may be a structure formed by repeating n times (n is an integer): disposing the first layer 11, the second layer 12, and the third layer 13 as a unit layer, and herein, for example, n is in a range of 1 to 100.

The first layer 11 and the second layer 12 are the same as previously described.

The beryllium oxide of the third layer 13 epitaxially grows on a modified crystal structure of the second layer 12 and thus may have a modified structure, which is different from a crystal structure that is a stable phase of a beryllium oxide, that is, a Wurtzite crystal structure.

For example, in a crystal structure of the beryllium oxide of the third layer 13, a Be—O bond length may be different from a Be—O bond length in a Wurtzite crystal structure and for example in the crystal structure of beryllium oxide of the third layer 13, the Be—O bond length may be longer than the Be—O bond length in the Wurtzite crystal structure.

For example, in the crystal structure of beryllium oxide of the third layer 13, the Be—O bond length may be greater than or equal to about 1.70 Å, for example about 1.70 Å to about 1.83 Å. For the reference, in the Wurtzite crystal structure, the Be—O bond length is about 1.66 Å.

In FIGS. 1 and 2, the composites have layered structures, but are not limited thereto. The composites may include at least one first layer including a metal oxide of a rocksalt-type crystal structure and at least one second layer including a beryllium oxide wherein the first layer and the second layer are independently stacked continuously or discontinuously to form a layered structure. For example, in an embodiment more than one first layer, more than one second layer (or more than one third layer) may be present. The more than one first layer and the more than one second layer may be stacked alternately (discontinuously) as shown in FIG. 1. In an embodiment, multiple first layers may be stacked continuously (one on the other) or multiple second layers may be stacked continuously (one on the other), provided that at least one of the first layers and at least one of the second layers is present. This configuration allows layers of different thicknesses to be used.

In an embodiment, the composite of the beryllium oxide and the metal oxide having the rocksalt-type crystal structure may be a multi-nary oxide.

The multi-nary oxide may be for example represented by Chemical Formula 1.

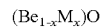

(Be$_{1-x}$M$_x$)O   Chemical Formula 1

In Chemical Formula 1,

M is a Group II element except beryllium, and

0<x≤0.80.

For example, in Chemical Formula 1, M may be Mg, Ca, Sr, Ba, or a combination thereof.

For example, in Chemical Formula 1, x may be in the range of 0.50<x≤0.80, 0.60≤x≤0.80, or 0.70≤x≤0.80.

Figure 3:
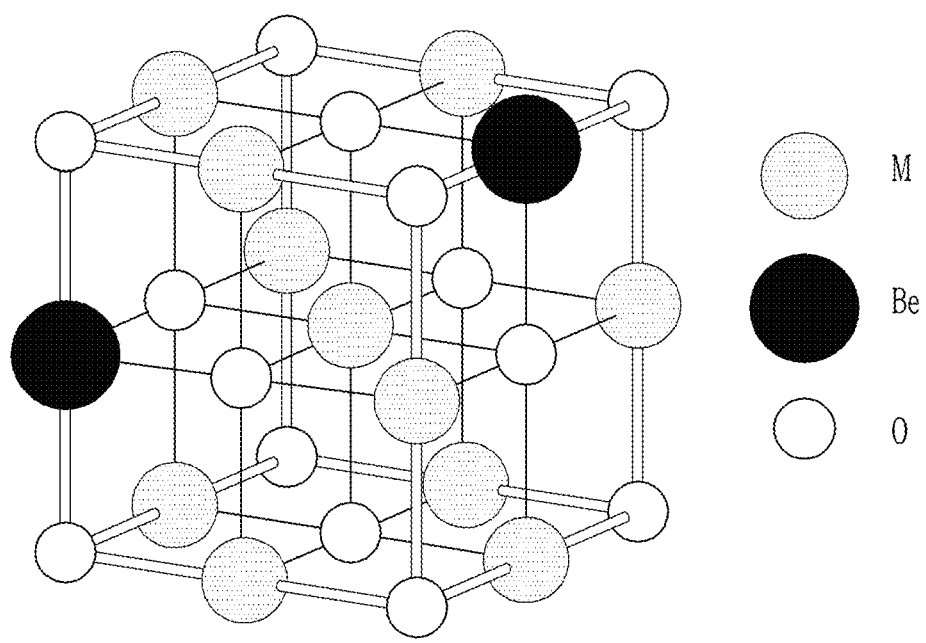
FIG. 3 is schematic view showing a composite including a beryllium oxide and a metal oxide having a rocksalt-type crystal structure according to an embodiment.

FIG. 3 is schematic view showing a composite according to an embodiment.

Referring to FIG. 3, the composite 10 may have a rocksalt-type crystal structure represented by a face-centered cubic lattice (fcc) and a part of M elements may be substituted with beryllium (Be).

In the crystal structure of the multi-nary oxide, a Be—O bond length may be different from an M-O bond length and for example the M-O bond length may be longer than the Be—O bond length. For example, the Be—O bond length may be greater than or equal to about 1.70 Å, for example about 1.70 Å to about 1.83 Å. This Be—O bond length is different from a Be—O bond length (about 1.66 Å) of a Wurtzite crystal structure. For example, each bond length of Mg—O, Ca—O, and Sr—O is about 2.11 Å, about 2.39 Å, and about 2.57 Å.

The multi-nary oxide may be an atomic layer deposition film formed by an atomic layer deposition, but is not limited thereto. The multi-nary oxide may be embodied by a method such as physical vapor deposition (PVD) or a molecular beam epitaxy (MBE), and the like, but is not limited thereto.

In this way, the dielectric according to an embodiment may simultaneously have a relatively high dielectric constant and large energy bandgap. The dielectric may include a metal oxide having a rocksalt-type crystal structure which is a stable phase under ambient conditions and a beryllium oxide as a composite. Accordingly, the dielectric according to an embodiment may secure, e.g., provide, improved quality by decreasing a leakage current as well as securing capacitance of an electronic device manufactured by applying the above dielectric, for example, a small pitch-sized electronic device.

For example, the dielectric may be used in a capacitor or a transistor.

The capacitor or the transistor may be applied to various electronic devices, for example a DRAM device, a CPU device, or a flash memory device effectively. For example, the dielectric may be effectively applied to a capacitor of the DRAM device, a capacitor of the CPU device, a blocking oxide layer of the flash memory device.

Figure 4:
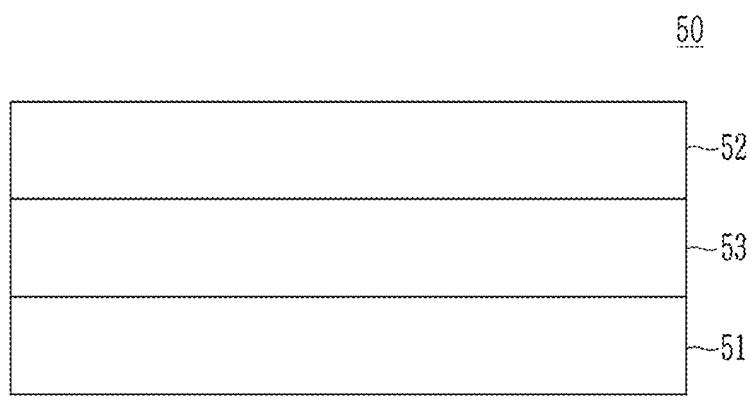
FIG. 4 is a schematic view showing a capacitor according to an embodiment.

FIG. 4 is a schematic view showing a capacitor according to an embodiment.

Referring to FIG. 4, a capacitor 50 according to an embodiment includes a pair of electrodes 51 and 52 facing each other and a ceramic dielectric 53 between the pair of electrodes 51 and 52.

The pair of electrodes 51 and 52 include a conductor such as a metal a metal nitride, or a combination thereof and may include for example nickel (Ni), gold (Au), platinum (Pt), palladium (Pd), copper (Cu), silver (Ag), aluminum (Al), tungsten (W), titanium (Ti), tantalum (Ta), iridium (Ir), tin (Sn), an alloy thereof, a nitride thereof, or a combination thereof, but is not limited thereto. The pair of electrodes 51 and 52 may be for example a metal plate, a conductive layer disposed on a substrate, or a metal-plated plate on a substrate. Herein, the substrate may be for example a glass substrate, a semiconductor substrate, a polymer substrate, or a combination thereof, but is not limited thereto.

The dielectric 53 includes the composite of the beryllium oxide and the metal oxide having the rocksalt-type crystal structure which is the same as described above.

Figure 5:
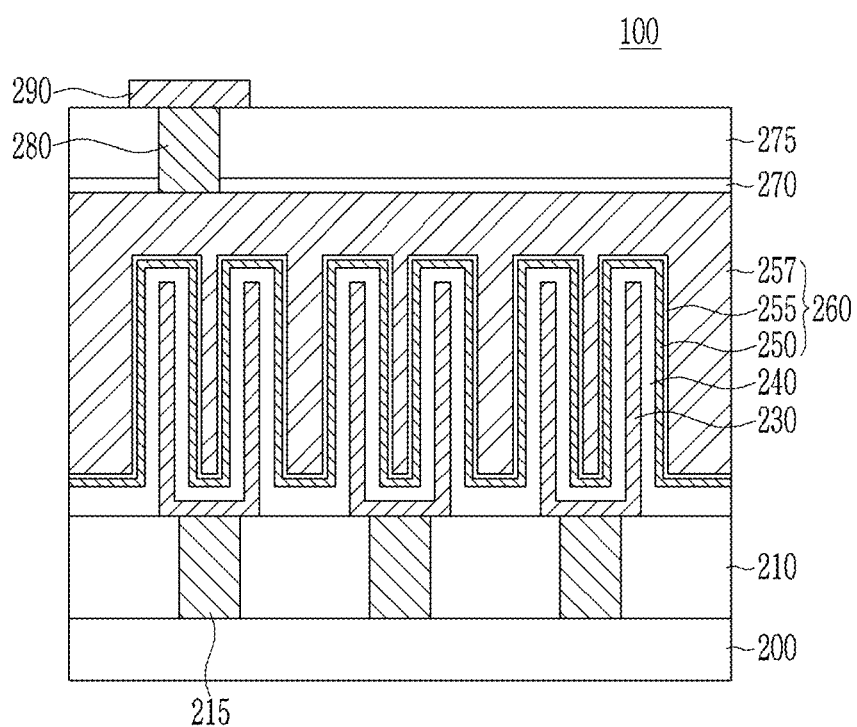
FIG. 5 is a schematic view showing a DRAM device including a capacitor according to an embodiment.

FIG. 5 is a schematic view showing a DRAM device including a capacitor according to an embodiment.

Referring to FIG. 5, a DRAM device 100 according to an embodiment includes a substrate 200, a lower insulation layer 210, a lower electrode 230, a dielectric 240, and an upper electrode 260, a passivation film 270, an upper insulation layer 275, and a wire 290.

The substrate 200 may be a semiconductor substrate such as a monocrystal silicon substrate, a monocrystal germanium substrate, a silicon-germanium substrate, a silicon-on-insulator (SOI) substrate, a germanium-on-insulator (GOI) substrate, and the like. The substrate 200 may further include for example a Group III-V compound such as GaP, GaAs, or GaSb. On the substrate 200, for example a device circuit such as a transistor may be formed.

The lower insulation layer 210 may be formed on the substrate 200, and may be made of, for example an oxide, a nitride, an oxynitride, or a combination thereof for example a silicon oxide such as plasma enhanced silicon oxide (PEOX), tetraethyl orthosilicate (TEOS), or silicate. The lower insulation layer 210 may have a lower contact 215. The lower contact 215 may be formed by forming a filled conductive layer on the lower insulation layer 210 and planarizing the upper surface of the conductive layer through a chemical mechanical polishing process, an etch back process, or a combination thereof. The lower contact 215 may be electrically connected to a device circuit connected to the substrate 200.

The lower electrode 230 may be made of a conductor such as a metal a metal nitride, or a combination thereof for example a metal such as copper, aluminum, tungsten, platinum, rubidium, iridium, titanium, or tantalum, a metal nitride such as titanium nitride, tantalum nitride, or tungsten nitride, or a combination thereof. For example, the lower electrode 230 may be made of titanium nitride. The lower electrode 230 may have a cylinder or cup shape and may be a storage electrode of the capacitor.

The dielectric 240 is formed along the surface of the lower electrode 230 and may have a substantially equivalent profile to that of the lower electrode 230. The dielectric 240 includes the composite of the beryllium oxide and the metal oxide having the rocksalt-type crystal structure which is the same as described above. For example, when the lower electrode 230 is formed of titanium nitride, the titanium nitride has a rocksalt-type crystal structure and thus may effectively deduce an epitaxial growth of the above composite. Accordingly, the lower electrode 230 and the dielectric 240 are effectively matched and thus may improve performance of a capacitor.

The upper electrode 260 may include a first upper electrode 250, a diffusion barrier 255, and a second upper electrode 257. However, it is not limited thereto and may be a mono-layered electrode.

The first upper electrode 250 is formed along the surface of the dielectric 240 and may have a substantially equivalent profile to that of the dielectric 240. The first upper electrode 250 may be made of a conductor such as a metal, a metal nitride, or a combination thereof for example a metal such as copper, aluminum, tungsten, platinum, rubidium, iridium, titanium, or tantalum, a metal nitride such as titanium nitride, tantalum nitride, or tungsten nitride, or a combination thereof. For example, the first upper electrode 250 may be made of titanium nitride.

The diffusion barrier 255 is formed along the surface of the first upper electrode 150 and may have a substantially equivalent profile to that of the first upper electrode 150. The diffusion barrier 255 may include for example a conductive oxide. The diffusion barrier 255 may be omitted.

The second upper electrode 257 may be a conductive layer and include, for example, polysilicon or amorphous silicon doped with impurity, silicon-germanium doped with impurities, and the like but is not limited thereto. The second upper electrode 257 may be omitted.

The lower electrode 230, the dielectric 240, and the upper electrode 250 may be formed as a capacitor.

The passivation film 270 may be formed on the upper electrode 250 and may be made of for example silicon oxide. The passivation film 270 may suppress leakage of charges stored in the capacitor.

The upper insulation layer 275 may be formed on the passivation film 270, and may be made of, for example an oxide, a nitride, an oxynitride, or a combination thereof for example a silicon oxide such as PEOX, TEOS, or silicate. The upper insulation layer 275 may have an upper contact 280.

The wire 290 is formed on the upper insulation layer 275. The wire 290 may be electrically connected to the upper electrode 250 through the upper contact 280.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A dielectric, comprising
   a composite comprising a metal oxide having a rocksalt crystal structure and a beryllium oxide,
   wherein
   the composite comprises
   a first layer comprising the metal oxide having the rocksalt crystal structure, and
   a second layer on the first layer, the second layer comprising the beryllium oxide having a modified crystal structure, and
   wherein in the modified crystal structure of the beryllium oxide of the second layer, a Be—O bond length is longer than a Be—O bond length in a beryllium oxide of a Wurtzite crystal structure.

2. The dielectric of claim 1, wherein the metal oxide having the rocksalt crystal structure comprises a Group II element except beryllium.

3. The dielectric of claim 1, wherein the metal oxide having the rocksalt crystal structure comprises Mg, Ca, Sr, Ba, or a combination thereof.

4. The dielectric of claim 1, wherein the dielectric has a dielectric constant of greater than or equal to about 10 and an energy bandgap of greater than or equal to about 6 electronvolts.

5. The dielectric of claim 1, wherein the dielectric satisfies Relationship Equation 1:

$$E_g \times k > 80 \qquad \text{Relationship Equation 1}$$

wherein, in Relationship Equation 1,
$E_g$ is an energy bandgap, and
$k$ is a dielectric constant.

6. A capacitor, comprising
   a pair of electrodes facing each other, and
   the dielectric of claim 1 between the pair of electrodes.

7. An electronic device comprising the capacitor of claim 6.

8. A transistor comprising the dielectric of claim 1.

9. An electronic device comprising the transistor of claim 8.

10. An electronic device comprising the dielectric of claim 1.

11. The dielectric of claim 1, wherein in a crystal structure of the beryllium oxide of the second layer, a Be—O bond length is longer than a Be—O bond length in a beryllium oxide of a Wurtzite crystal structure.

12. The dielectric of claim 11, wherein in the crystal structure of the beryllium oxide of the second layer, the Be—O bond length about 1.70 angstroms to about 1.83 angstroms.

13. A dielectric, comprising
    a composite comprising a metal oxide having a rocksalt crystal structure and a beryllium oxide,
    wherein
    the composite comprises
    a first layer comprising the metal oxide having the rocksalt crystal structure, and
    a second layer on the first layer, the second layer comprising the beryllium oxide, and
    wherein the beryllium oxide of the second layer has a different structure from a Wurtzite crystal structure.

14. The dielectric of claim 13, wherein the composite further comprises a third layer on the second layer, the third layer comprising the beryllium oxide, and wherein the beryllium oxide of the third layer has a different structure from a Wurtzite crystal structure.

15. The dielectric of claim 13, wherein
    the composite comprises more than one of the first layer or more than one of the second layer, or both and
    the more than one of the first layers, the more than one of the second layers, or both, are each independently stacked continuously or discontinuously.

16. The dielectric of claim 13, wherein in a crystal structure of the beryllium oxide of the second layer, a Be—O bond length is longer than a Be—O bond length in a beryllium oxide of a Wurtzite crystal structure.

17. The dielectric of claim 16, wherein in the crystal structure of the beryllium oxide of the second layer, the Be—O bond length about 1.70 angstroms to about 1.83 angstroms.

18. The dielectric of claim 13, wherein in a crystal structure of the beryllium oxide of the second layer, a Be—O bond length is greater than or equal to about 1.70 angstroms.

19. The dielectric of claim 13, wherein the first layer and the second layer independently are an atomic layer deposition film.

20. A dielectric, comprising
    a composite comprising a metal oxide having a rocksalt crystal structure and a beryllium oxide,
    wherein
    the composite comprises
    a first layer comprising the metal oxide having the rocksalt crystal structure, and
    a second layer epitaxially grown on the first layer, the second layer comprising the beryllium oxide having a modified crystal structure.

21. The dielectric of claim 20, wherein the composite further comprises a third layer epitaxially grown on the second layer, the third layer comprising the beryllium oxide.

22. The dielectric of claim 20, wherein in a crystal structure of the beryllium oxide of the second layer, a Be—O bond length is longer than a Be—O bond length in a beryllium oxide of a Wurtzite crystal structure.

23. The dielectric of claim 22, wherein in the crystal structure of the beryllium oxide of the second layer, the Be—O bond length about 1.70 angstroms to about 1.83 angstroms.

* * * * *